US008367505B2

(12) United States Patent
Hanafi et al.

(10) Patent No.: US 8,367,505 B2
(45) Date of Patent: Feb. 5, 2013

(54) MEMORY IN LOGIC CELL

(75) Inventors: Hussein I. Hanafi, Basking Ridge, NJ (US); Leonard Forbes, Corvallis, OR (US); Alan R. Reinberg, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 581 days.

(21) Appl. No.: 12/615,961

(22) Filed: Nov. 10, 2009

(65) Prior Publication Data

US 2010/0055871 A1    Mar. 4, 2010

Related U.S. Application Data

(62) Division of application No. 11/821,462, filed on Jun. 21, 2007, now Pat. No. 7,633,801.

(51) Int. Cl.
*H01L 21/336* (2006.01)

(52) U.S. Cl. ................... 438/283; 257/E21.623

(58) Field of Classification Search .............. 438/157, 438/201, 283, 176; 257/E21.623
See application file for complete search history.

(56) References Cited

U.S. PATENT DOCUMENTS

| | | | |
|---|---|---|---|
| 5,991,225 A | 11/1999 | Forbes et al. | |
| 6,124,729 A | 9/2000 | Noble et al. | |
| 6,153,468 A | 11/2000 | Forbes et al. | |
| 6,208,164 B1 | 3/2001 | Noble et al. | |
| 6,351,428 B2 | 2/2002 | Forbes | |
| 6,384,448 B1 | 5/2002 | Forbes | |
| 6,486,027 B1 | 11/2002 | Noble et al. | |
| 6,635,923 B2 | 10/2003 | Hanafi et al. | |
| 6,812,516 B2 | 11/2004 | Noble et al. | |
| 6,815,296 B2 * | 11/2004 | Dennard et al. | 438/283 |
| 7,089,515 B2 | 8/2006 | Hanafi et al. | |
| 7,129,749 B1 | 10/2006 | Fenstermaker et al. | |
| 7,354,809 B2 * | 4/2008 | Yuan et al. | 438/157 |
| 7,402,850 B2 | 7/2008 | Bhattacharyya | |
| 2003/0043637 A1 | 3/2003 | Forbes et al. | |
| 2003/0048666 A1 | 3/2003 | Eldridge et al. | |
| 2005/0024945 A1 | 2/2005 | Forbes | |
| 2006/0002192 A1 | 1/2006 | Forbes et al. | |
| 2006/0284236 A1 | 12/2006 | Bhattacharyya | |
| 2007/0012988 A1 | 1/2007 | Bhattacharyya | |
| 2007/0064494 A1 | 3/2007 | Morton et al. | |

OTHER PUBLICATIONS

Avei, U., et al., "Back-gated MOSFETs with controlled silicon thinckness for adaptive threshold-voltage control", Electronics Letters, vol. 40, No. 1 (Jan. 8, 2004).
Drude, Paul, "Technology Research News", Nature, Institut Fur Feskorperelektronik, (1 pg.) (Oct. 2, 2003).
Hanyu, T., et al., "Multiple-Valued Logic-in-Memory VLSI . . . ", IEEE Int. Solid State Circuits Conference, Dig. Tech. papers, pp. 194-195, (Feb. 1998).

(Continued)

*Primary Examiner* — Quoc Hoang
(74) *Attorney, Agent, or Firm* — Brooks, Cameron & Huebsch, PLLC

(57) ABSTRACT

Methods, devices, and systems for a memory in logic cell are provided. One or more embodiments include using a cell structure having a first gate, a second gate, and a third gate, e.g., a control gate, a back gate, and a floating gate, as a memory in logic cell. The method includes programming the floating gate to a first state to cause the memory in logic cell to operate as a first logic gate type. The method further includes programming the floating gate to a second state to cause the memory in logic cell to operate as a second logic gate type.

17 Claims, 9 Drawing Sheets

OTHER PUBLICATIONS

Kautz, William H., "Cellular Logic-in-Memory Arrays", IEEE Transactions on Computers. vol. C-18, No. 8 (Aug. 1969).

Lin, Hao, et al., "Super-Self-Aligned Back-Gate/Double-Gate Planar Transistors . . . ", Device Research Conference, Tech. Digest, pp. 37-38 (Jun. 2006).

Ney, A., et al., "Programmable computing with a single magnetoresistive element", Nature, vol. 425, pp. 485-487 (Oct. 2, 2003).

Tanaka, Tetsu, et al., "Analysis of P+ Poly Si Double-Gate Thin-File SOI MOSFETS", IEDM Technology Digest, pp. 683-686 (1991).

* cited by examiner

|     | CG (236) | BG (238) | FG (234) | OUTPUT (240) | DEVICE STATE (242) |
|-----|----|----|-----|--------|--------------|
| 231 NAND | 1 | 1 | (-) | 0 | ON |
|     | 0 | 1 | (-) | 1 | OFF |
|     | 1 | 0 | (-) | 1 | OFF |
|     | 0 | 0 | (-) | 1 | OFF |
| 232 NOR | 1 | 1 | 0 | 0 | ON |
|     | 0 | 1 | 0 | 0 | ON |
|     | 1 | 0 | 0 | 0 | ON |
|     | 0 | 0 | 0 | 1 | OFF |

*Fig. 2*

MEMORY IN LOGIC CELL

CROSS-REFERENCE TO RELATED APPLICATIONS

This application is a Divisional of U.S. patent application Ser. No. 11/821,462 filed Jun. 21, 2007, the specification of which is incorporated by reference herein.

TECHNICAL FIELD

The present disclosure relates generally to memory in logic cells and, more particularly, to cell structure having a first gate, a second gate, and a third gate as a memory in logic cell.

BACKGROUND

Communication bottleneck between memory and logic modules is one of the most serious problems in recent deep submicron very-large-scale integration (VLSI) systems. The programmable computing array is more complex to build and has lower storage density than a normal memory array because of the overhead involved in the storage and logic.

A floating gate MOS transistor is generally used as a memory cell device of flash EEPROMs, which can be back-gated. One example of a back-gated MOSFET transistor is provided in U.S. Pat. No. 7,089,515 entitled, "Threshold Voltage Roll-Off Compensation using Back-Gated MOSFET Devices for System High-Performance and Low Standby Power", issued Aug. 8, 2006. However, the back-gated transistors in the above referenced patent are directed toward compensating the threshold voltage roll-off.

An example of programmable logic arrays using floating gates is provided in commonly assigned U.S. Pat. No. 6,124,729 entitled, "Field Programmable Logic Arrays with Vertical Transistors", issued Sep. 26, 2000. The cells therein have a semiconductor pillar providing a shared source and drain region for two separate transistors each having individual floating gates and control lines. Whole arrays of such structures are field programmed together, versus programming on an individual cell basis, in order to function as a particular type of logic plane. In this previous approach, however, the number of connects between planes due to the absence of programmability of each cell independently and need to connect various entire planes in a certain way to achieve a desired logic state may add to the complexity and area consumed by such a layout.

BRIEF DESCRIPTION OF THE DRAWINGS

FIG. 2 illustrates a truth table for various first, second, and third logical inputs to the memory in logic cell shown in FIG. 3A.

DETAILED DESCRIPTION

Figure 1A:
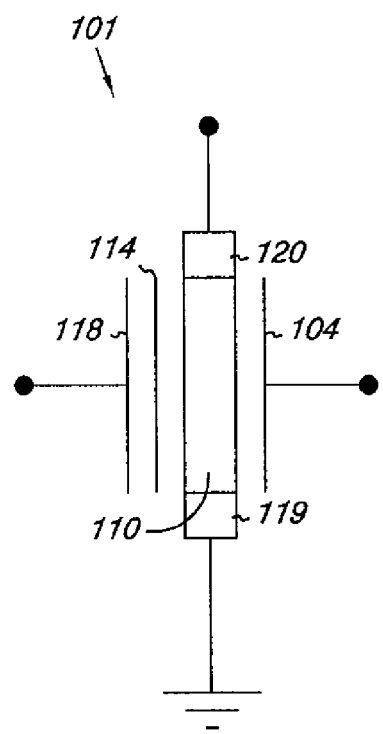
FIG. 1A is a schematic illustration of an embodiment of a memory in logic cell that can be programmed and operated as part of a programmable computing array.

Methods, devices, and systems for a memory in logic cell are provided. One or more embodiments include using a cell structure having a first gate, a second gate, and a third gate, e.g., a control gate, a back gate, and a floating gate, as a memory in logic cell. The method includes programming the floating gate to a first state to cause the memory in logic cell to operate as a first logic gate type. The method further includes programming the floating gate to a second state to cause the memory in logic cell to operate as a second logic gate type.

In one or more embodiments, the control gate associated with the floating gate is used as a first input to the memory in logic cell. The back gate is used as a second input to the memory in logic cell and the floating gate is either charged or discharged and used as a third input to the memory in logic cell. When the floating gate (third input) to the memory in logic cell is charged, the memory in logic cell performs a first logical operation based on the first and second logical inputs provided to the control gate and the back gate. When the floating gate (third input) to the memory in logic cell is uncharged, the memory in logic cell performs a second logical operation based on the first and second inputs provided to the control gate and the back gate.

In one or more embodiments, the memory in logic cell is configured as a thin semiconductor channel region having a floating gate and an associated control gate on one side of the channel region along with a back gate on the opposite side of the channel region. The channel region is configured to a thickness and doping level such that a voltage threshold ($V_t$) of the channel region depends on the charge on the floating gate and a potential applied to the back gate. In this manner, the voltage threshold of the channel region is dependent on the floating gate and is modulated by the back gate.

A memory-in-logic structure in one or more embodiments, such as that described herein in accordance with one or more embodiments, in which storage functions are distributed over a logic-circuit plane to achieve programmable computing, can reduce the bottleneck between memory and logic modules. The memory-in-logic structure allows each individual cell in an array to be programmed to a desired mode, thus allowing for greater flexibility in configuring an array of cells to a particular desired state. A memory-in-logic structure provides for a simplified circuit design due to the flexibility associated with each cell being individually programmable. Also, there should be an increase in reliability associated with these structures because of the decrease in the number of connects between cells due to the programmability of each cell and the lack of the need to connect certain cells in a certain way to achieve a desired logical state. When a storage function is included in each cell of a programmable computing array, the array may be regarded as a logic array whose gates and connections can be programmed to realize a desired logical behavior.

FIG. 1A is a schematic illustration of an embodiment of a memory in logic cell that can be programmed and operated as part of a programmable computing array. In the schematic of FIG. 1A, the cell 101 includes a structure having a first gate, a second gate, and a third gate, e.g., a control gate 118, a back gate 104, and a floating gate 114. Also, the cell 101 includes a channel region with a source region 119, a body region 110, and a drain region 120.

As shown schematically in FIG. 1A, the cell 101 includes a control gate 118 and a back gate 104 formed on opposing sides of the body region 110. A floating gate 114 is shown associated with the control gate 118 and on the opposite side of the body region 110 than the back gate 104. One example of a method for forming a transistor structure of cell 101 is provided in U.S. Pat. No. 6,635,923, entitled, "Damascene Double-gate MOSFET with Vertical Channel Regions", issued Oct. 21, 2003 and having at least one common inventor. Also, using a back gate to compensate for threshold voltage is provided in U.S. Pat. No. 7,089,515 entitled, "Threshold Voltage Roll-Off Compensation using Back-Gated MOSFET Devices for System High-Performance and Low Standby Power", issued Aug. 8, 2006 and having at least one common inventor.

Figure 1B:
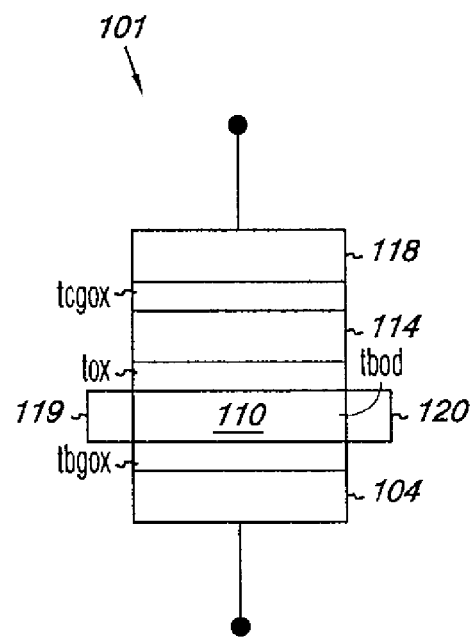
FIG. 1B illustrates an embodiment of a memory in logic cell that can be programmed and operated as part of a programmable computing array.

In contrast to this earlier work, however, as shown in an example embodiment in FIG. 1B, the use of a nonvolatile memory cell in a programmable computing array with a body region 110 that has a width which is thin, e.g., less than 100 Å, and a doping concentration of less than $1 \times 10^{17}/cm^3$. For example, one embodiment can have a doping concentration of $5 \times 10^{15}/cm^3$, which is sufficiently low so that a voltage threshold ($V_t$) depends on a charge on the floating gate 114 and is modulated by a potential applied to the back gate 104. For example, when the body region 110 has a thickness ("tbod") of 12 nm and tunneling oxide thickness ("tox") of 4 nm, the back gate 104 oxide thickness ("tbgox") would be 4 nm and the control gate 118 oxide thickness ("tcgox") would be 12 nm. That is, the voltage threshold ($V_t$) necessary to create a channel between the source region 119 and the drain region 120 on the body region 110 is dependent on the charge on the floating gate 114 and modulated by the potential applied to the back gate 104.

Hence, in contrast to the above earlier work, one or more embodiments are such that the respective voltage threshold, e.g., $V_t$, and the floating gate, 114 and back gate 104, of the cell 101 are dependent on the charge and potential applied to each respectively.

In one or more embodiments, as described in more detail below, the control gate, e.g., 118 serves as a first logical input to the cell 101. The back gate, e.g., 104, serves as a second logical input to the cell 101 and the floating gate 114 serves as a third logical input to the cell 101. The cell 101 can be programmed such that the cell 101 performs a first logical operation when the floating gate 114 is in a first state, e.g., charged, and performs a second logical operation when the floating gate 114 is in a second state, e.g., uncharged.

FIG. 1B illustrates an embodiment of a memory in logic cell that can be programmed and operated as part of a programmable computing array. In the example embodiment described in FIG. 1B, the cell structure 101 has a back gate 104. In this embodiment, the cell structure 101 includes a floating gate, 114, and also an associated control gate, 118. As mentioned above, the charge on the floating gate, 114, determines the voltage threshold to turn the transistor on and allow electron flow from the source 119 to the drain 120 through the body region 110. The voltage threshold for the cell structure depends on the charge on the floating gate 114 is modulated by the back gate 104 input signal, e.g., potential applied to the back gate 104, as a second logical input to the cell 101.

In one or more embodiments, which will be described in more detail below in connection with the truth table shown in FIG. 2, if floating gate, 114, is charged negative the cell structure 101, e.g., memory in logic element, can only be turned on if both the control gate, 118, and the back gate, 104, e.g., first and second logical inputs, have a positive potential applied thereto, e.g., a positive, modulating second input signal to lower the voltage threshold and a positive first input signals above the voltage threshold. Alternatively, if the floating gate, 114, is uncharged, either control gate, 118, or the back gate, 104, going positive, e.g., either a positive first input on the control gate 118 and/or a positive, modulating third input on the back gate 104, can turn the transistor on. One of ordinary skill in the art will appreciate the manner in which the floating gate, 114, can be charged and charge removed therefrom, e.g., either through hot electron injection, Fowler Nordheim tunneling, etc. Likewise, one of ordinary skill in the art will appreciate the manner in which exceeding a voltage threshold, e.g., $V_t$, can create inversion layers in the body region 110 sufficient to a form the conductive channel sufficient to permit conduction between the source 119 and drain 120 regions.

As described in more detail below in connection with the truth table of FIG. 2, if the floating gate, 114, is not charged, the voltage threshold, $V_t$, necessary to form a conductive channel in the body region 110 will be lower. If, as illustrated further in connection with the truth table of FIG. 2, both a potential applied to the first input, e.g., control gate 118, and potential applied to the second input, e.g., back gate 104, are low, then a logical output of "1" will be produced. However, when the floating gate, 114, is in this uncharged state, a high potential applied to either the first input, e.g., control gate 118, or the second input, e.g., back gate 104, will be sufficient to individually turn the transistor structure of cell 101 "ON" producing conduction between the source 119 and the drain 120 such that a logical output of "0" will be produced. As the reader will appreciate, when the floating gate, 114, is in this uncharged state, a high potential applied to both the first input, e.g., control gate 118, and the second input, e.g., back gate 104, will turn the transistor structure of cell 101 "ON" producing conduction between the source 119 and the drain 120 such that a logical output of "0" will be produced, e.g., a NOR logical operation performed.

Alternatively, as described in more detail below in connection with the truth table of FIG. 2, if the floating gate, 114, is charged, i.e., charged negative, the voltage threshold, $V_t$, necessary to form conductive channels in the body region 110 will be high. If, as illustrated further in connection with the truth table of FIG. 2, both a potential applied to the first input, e.g., control gate 118, and potential applied to the second input, e.g., back gate 104, are low, then a logical output of "1" will be produced, e.g., the cell will not turn "ON". That is, the potential applied to the first and/or second input, e.g., control gate 118 and back gate 104, will not be sufficient to overcome the voltage threshold, $V_t$, and create a channel to produce conduction between source region 119 and drain region 120. According to one or more embodiments, either high input alone to the first or second input, e.g., control gate 118 or back gate 104, will not by itself be sufficient to overcome, $V_t$, sufficient to turn on the transistor structure of cell 101. The charge state of the floating gate, 114, will control and the potential applied to the back gate, 104, will modulate the threshold voltage, e.g., $V_t$.

Hence, according to one or more embodiments, if the floating gate 114 is charged negative, e.g., a second programmed state, then an input to only one of the control gate 118 or the back gate 104, e.g., first and second inputs, is insufficient to individually turn the transistor structure of cell 101 "ON" and produce conduction between the source 119 and the drain 120 such that a logical output of "1" will be produced. When the floating gate is charged negative, e.g., a second programmed state, then only a positive input signal applied to both the control gate 118 and the back gate 104, e.g., first and second inputs, will be sufficient to turn the transistor structure of cell 101 "ON" and produce conduction between the source 119 and the drain 120 such that a logical output of "0" will be produced. e.g., a logical NAND operation. That is, the cell structure 101 will only conduct when both inputs, e.g., control gate 118 and back gate 104 are both high.

Again, as noted above, the charge state, e.g., either charged or not charged will control the voltage threshold $V_t$, such that the cell structure 101 will turn "ON" in the charged state if and only if both the first and second inputs, e.g., control gate 118 and back gate 104, are at a positive or high logic level. The voltage threshold, according to one or more embodiments, can be determined by appropriate doping, e.g., approximately $5\times10^{15}/cm^3$, and thickness, e.g. width of the body region 110 approximately 100 Å, stack and gate insulator thickness, work functions of the gate materials, and voltages of the logic levels, e.g., charge on the third logic input (floating gate 114), potential applied to the first logic input (control gate 118), and potential applied to the second logic input (back gate 104).

Figure 1C:
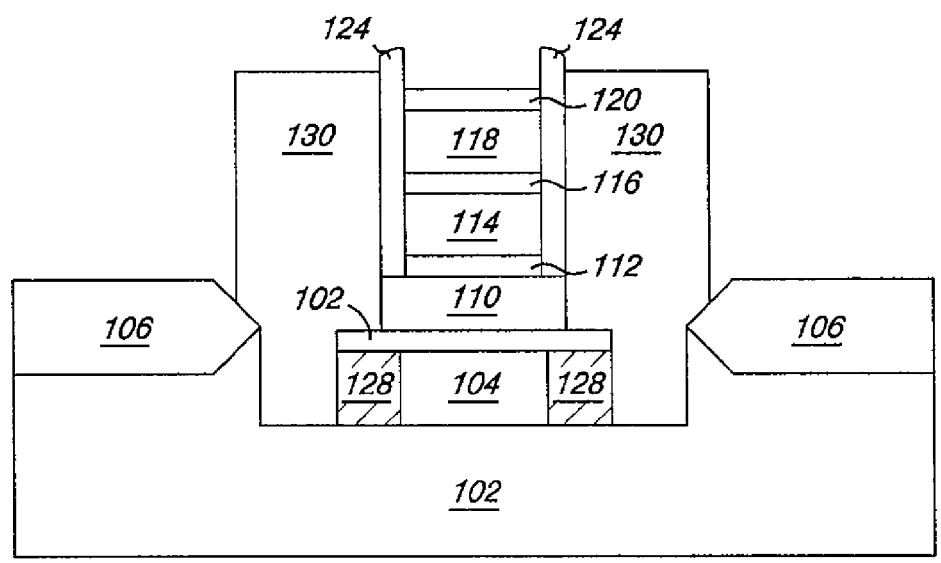
FIG. 1C illustrates an embodiment of the cell structure comprising a transistor with a first gate, a second gate, and a third gate configurable as a memory in logic cell.

FIG. 1C illustrates an embodiment of the cell structure comprising a transistor with a first gate, a second gate, and a third gate, e.g., a control gate, a back gate, and a floating gate, configurable as a memory in logic cell. The transistor in FIG. 1C has a silicon channel 110 with two source/drain regions 130. The transistor operates by having a voltage potential across the silicon channel 110 between the source region 130 and the drain region 130 to cause the transistor to turn on and allow electrical flow through the body.

In one or more embodiments, a self-aligned back gate, control gate, and floating gate cell is used as a programmable logic device. In one or more embodiments, the back gate 104 is on an oxide layer 102 with LOCOS regions 106 and has two oxidized regions 128 on the ends of the back gate 104 to define it thickness. In FIG. 1C, alternating nitride and oxide layers form the stack containing the control gate 118 and the floating gate 114. A gate oxide layer 112 separates the silicon channel 110 from the floating gate 114. In one or more embodiments, the floating gate 114 can be formed from a dope poly-silicon or a nitride. A control gate dielectric 116 is between the control gate 118 and the floating gate 114. In some embodiments, the control gate 118 is formed from poly-silicon. An oxide dielectric layer 120 caps the control gate 118. The silicon channel's thickness is defined by oxide spacers 124 that are on each side of the silicon channel 110.

Figure 3A:
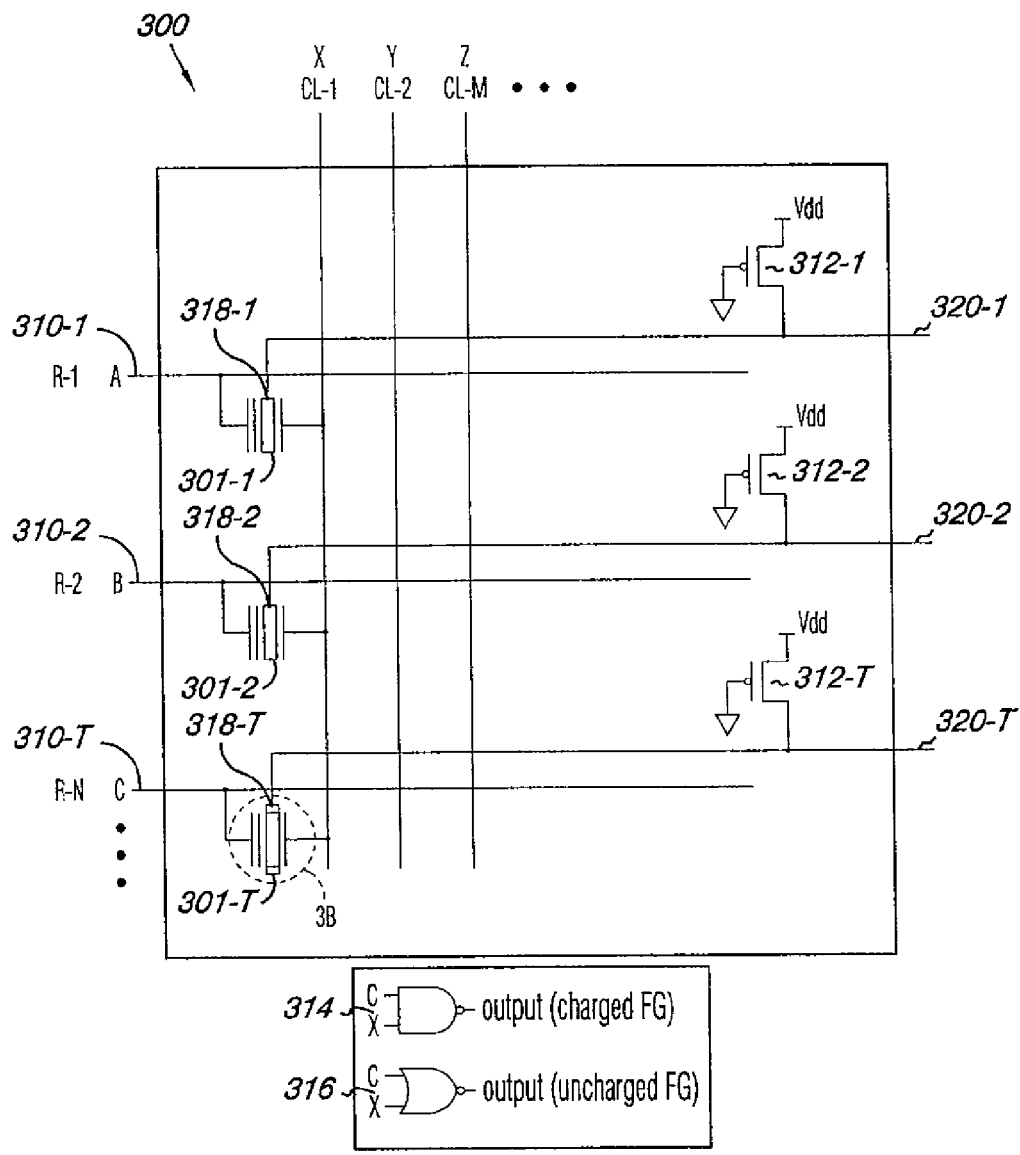
FIGS. 3A and 3B illustrate a programmable computing array implementing embodiments of the memory in logic cells described in connection with FIGS. 1A-2.
Figure 3B:
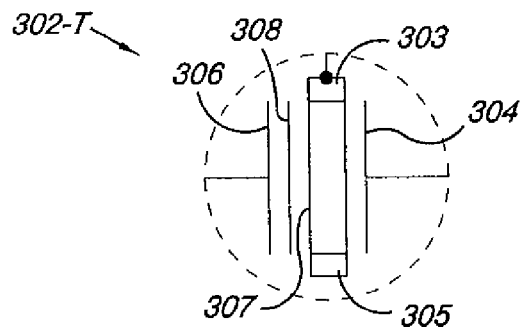

FIG. 2 illustrates a truth table for various first, second, and third logical inputs to the memory in logic cell shown in FIGS. 3A and 3B. The table in FIG. 2 shows a truth table for various first, second, and third logical inputs to the programmable computing array 300 shown in FIGS. 3A and 3B. The memory in logic cells, 301-1, 301-2, . . . , 301-T, are coupled to the p-type transistors, 312-1, . . . , 312-T, to output the logical value from the array. In this embodiment, the memory in logic cells, 301-1, 301-2, . . . , 301-T in the programmable computing array 300 function with the p-type transistors, 312-1, . . . , 312-T, to perform NAND and/or NOR logic functions, depending on the state, charged or uncharged, of the floating gate, 308 (third input) and for various potential (logic inputs) to the control gate, 306, and the back gate 304 (first and second logical inputs).

The third logical input is the floating gate, 308 (FG), to each of the memory in logic cells, 301-1, 301-2, . . . , 301-T, represented as either charged (−) or uncharged (0V) in column 234. In a first portion of the truth table 231, the truth table illustrates the logic performed by the output of the programmable computing array 300 when the floating gate, 308 (FG), is charged (−). In a second portion of the truth table 232, the truth table illustrates the logic performed by output of the programmable computing array 300 when the floating gate, 308 (FG), is uncharged (0V).

As shown in FIG. 3B, the first logical input is the potential applied to the control gate, 306 (CG), of the memory in logic cells, 301-1, 301-2, . . . , 301-T, represented as a logic "1" or logic "0" value (column 236) depending on a high or low potential applied to the control gate, 306 (CG), along a row, R-1, R-2, . . . , R-N respectively, of memory in logic cells, 301-1, 301-2, . . . , 301-T. The second logical input is the potential applied to the back gate, 304 (BG), of the memory in logic cells, 301-1, 301-2, . . . , 301-T, represented as a logic "1" or logic "0" value (column 238) depending on a high or low potential applied to the back gate, 304 (BG), along a column, CL-1, CL-2, . . . , CL-M, of memory in logic cells, 301-1, 301-2, . . . , 301-T.

As shown in the first portion of the truth table 231, when the floating gate, 308 (FG) is charged negative (−), the system functions as a first logical gate type to perform a first logical operation based on the first and the second logical inputs (CU and BG). That is, the output of the memory in logic cells, 301-1, 301-2, . . . , 301-T, function to perform a "NAND" logic operation such that only when a logical "1" value is applied to both the first logical input, e.g., the control gate 306 (CG), and to the second logical input, e.g., the back gate 304 (BG), will an output, as reflected in column 240, be a logical "0" value and the device state 242 is "ON".

As shown in the second portion of the truth table 232, when the floating gate, 308 (FG) is uncharged (0V), the system functions as a second logical gate type to perform a second logical operation based on the first and the second logical inputs (CG and BG). That is, the output of the memory in logic cells, 301-1, 301-2, . . . , 301-T, function to perform a "NOR" logic function such that when a logical "1" value is applied to either the first logical input, e.g., the control gate 306 (CG), or to the second logical input, e.g., the back gate 304 (BG), an output, as reflected in column 240, be a logical "0" value and the device state 242 is "ON". Here, only when a logical "0" value is applied to both the first logical input, e.g., the control gate 306 (CG), and to the second logical input, e.g., the second control gate 304 (BG), will an output, as reflected in column 240, be a logical "1" value.

FIGS. 3A and 3B illustrate a programmable computing array implementing embodiments of the memory in logic cells described in connection with FIGS. 1A-2. As shown in the embodiment of FIG. 3A the programmable computing array 300 includes a number of memory in logic cells, 301-1, 301-2, . . . , 301-T, arranged in a matrix of columns, CL-1, CL-2, CL-M, and rows, R-1, R-2, . . . , R-N. Each of the memory in logic cells, 301-1, 301-2, . . . , 301-T, in the programmable computing array 300 can include the structure and operation described in connection with FIGS. 1A-3 above. That is, the memory in logic cells, 301-1, 301-2, . . . , 301-T, include a floating gate, 308, (third input, FG) which are a side of a narrow, e.g., less than 100 Angstroms, semiconductor channel. A control gate, 306, (first input, CG) is formed opposing the floating gate, 308. A back gate, 304, (second input, BG) is formed on the opposite side of the channel region than the control gate 306 and the floating gate 308.

The semiconductor channel region can be formed upon a substrate according to known semiconductor fabrication techniques and include any number of suitable number of semiconductor materials. The semiconductor channel region is doped so as to form a source region 305, a body region 307, and a drain region 303. In one embodiment, the source regions 305 and drain regions 303 include n-type doping and the body regions 307 include p-type doping so as to form n-channel transistor structures to the memory in logic cells, 301-1, 301-2, . . . , 301-T. As shown in the embodiment of FIG. 3A, a contact 318-T is connected to the drain region 303 for each of the semiconductor channel regions. A conductive row line, e.g., 320-1, . . . , 320-T, along each row, R-1, . . . , R-N, is connected to contacts 318-1, . . . , 318-T. As shown in the embodiment of FIG. 3A, each of the row lines, 320-1, . . . , 320-T, are connected to a p-type transistor, 312-1, . . . , 312-T, in order to form an inverter output.

As explained above, each of the semiconductor channel regions in the programmable computing array 300 are sufficiently lightly doped, e.g., have a doping concentration of approximately $5 \times 10^{15}/cm^3$, such that a voltage threshold $V_t$ for the channel region depends on the charge or absence of charge stored on the floating gate 308 and is modulated by a gate potential applied to the back gate 304 as a second input. In this manner, the voltage threshold, $V_t$, of the channel regions in the programmable computing array 300 are dependent on the charge on the floating gate in each cell.

In connection with the truth table of FIG. 2, the logic that each of the cells, 301-1, 301-2, . . . , 301-T, outputs is dependent on the charge on the floating gate, e.g., 308, as a third input, and is modulated by a potential applied to a potential applied to a back gate, 304, as a second input. The memory in logic cells, 301-1, 301-2, . . . , 301-T, in the programmable computing array 300 are coupled to the p-type transistors, 312-1, . . . , 312-T, which are supplied with $V_{dd}$ voltage potential, to output the logical value for the cell. When the memory in logic cells, 301-1, 301-2, . . . , 301-T, in the programmable computing array 300 are turn "ON" and conducting, the row lines, 320-1, . . . , 320-T are pulled down to ground and the logical output for the cell is "0". When the memory in logic cells, 301-1, 301-2, . . . , 301-T, in the programmable computing array 300 are turn "OFF" by not conducting, the row lines, 320-1, . . . , 320-T are pulled up to $V_{dd}$ by the p-type transistors, 312-1, . . . , 312-T, therefore the logical output for the cell is "1". Hence, the programmable computing array 300 can function with the p-type transistors, 312-1, . . . , 312-T, to perform NAND and/or NOR logic functions, depending on the state, charged or uncharged, of the floating gate, 308 (third logical input) for various potential (logic inputs) to the control gate, 306, (first logical input) and to the back gate, 304, (second logical input).

Each of the memory in logic cells, e.g., 301-1, in the programmable computing array 300 can include the structure and operation described in connection with FIGS. 1A-2 above, e.g., can be programmed to perform a NOR 316 and a NAND 314 logical operation, etc.

As explained above, the logic function of a given cell 301-1, . . . , 301-T the array 300 is dependent on the charge on the floating gate, e.g., third input, and the potential applied to the back gate, e.g., second input, associated with the given cell 301-1, . . . , 301-T. A memory in logic cell 301-1, . . . , 301-T in the array 300 performs a NAND logic function when the floating gates of a cell 301-1, . . . , 301-T are charged negative, as described in connection with FIG. 2. A memory in logic cell 301-1, . . . , 301-T in the array 300 performs a NOR logic function when the floating gates are uncharged, as described in connection with FIG. 2.

Figure 4:
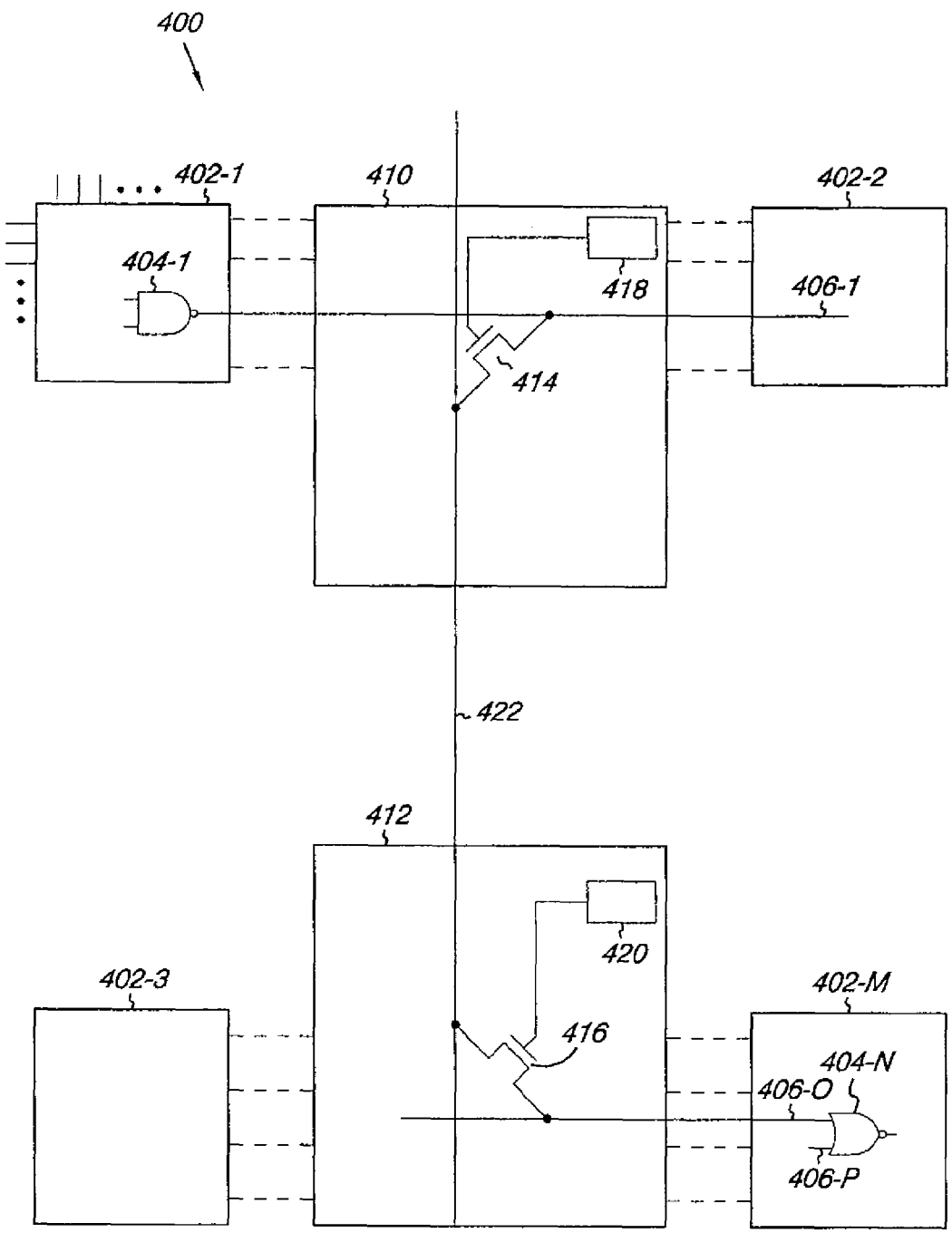
FIG. 4 illustrates an embodiment of a memory in logic computing system where multiple programmable computing arrays are coupled together via a programmable routing structure.

FIG. 4 illustrates an embodiment of a memory in logic computing system where multiple programmable computing arrays, e.g., 402-1, . . . , 402-M, are coupled together via a programmable routing structure, e.g., 410 and 412. The programmable computing arrays 402-1, . . . , 402-M implement embodiments of the memory in logic cells having the structure and operation described in connection with FIGS. 1A-3. That is, the floating gate, third input, and control gate, first input, and the back gate, second input, to the memory in logic cells of the arrays, 402-1, . . . , 402-M, are configurable to allow the memory in logic cells to serve as NAND or NOR logic gates, etc.

As shown in the embodiment of FIG. 4, the programmable computing arrays, 402-1, . . . , 402-M, can be connected through programmable routing structures 410, 412, etc. The programmable routing structures 410, 412, etc., can receive an output on row lines, e.g., 406-1, from a first programmable computing array, e.g., 402-1, and connect this signal on to other programmable computing arrays, effectively linking different logic blocks together to allow the logic functions to be combined. As shown in the embodiment of FIG. 4, the programmable routing structures 410, 412 can include a matrix of pass transistors, e.g., two pass transistors 414, 416, etc., and may themselves include programmable memory in logic cells, e.g., 418 and 420 as the same have been described herein, to control the gates of such pass transistors, e.g., 414, 416, etc.

Hence, the programmable routing structures 410, 412, etc., can be programmed using programmable logic devices 418, 420, such as the memory in logic cells described herein, to combine the logic signals from the memory in logic cells in the programmable computing arrays 402-1, . . . , 402-M, in a variety of ways. As shown in the embodiment of FIG. 4, a logic signal from a memory in logic cell in array 402-1 can be allowed to pass through the programmable routing structure 410 by addressing pass transistor 414 with address lines 422 and with the programmable logic device 418 to output a logical signal on line 406-1. Likewise address signals 422 can address pass transistor 416 together with the programmable logic device 420 to output a logical signal on line 406-O as an input to programmable computing array 402-M.

In this manner, an output of a first memory in logic cell, e.g., 404-1, in array 402-1, can be programmably connected as a first input, via line 406-O, to a second memory in logic cell, e.g., 404-N in array 402-M, via one or more programmable routing circuits, e.g., 410, 412, etc. Moreover, output of a third memory in logic cell can be connected as a second input, e.g., 406-P, to the second memory in logic cell, e.g., 402-M. As the reader will appreciate the second memory in logic cell, 402-M, can be configured to perform a third logical operation. Although the example embodiment of FIG. 4 illustrates an output from a first programmable computing array 402-1 as an output from a memory in logic cell 404-1 configured to perform a NAND logic function, and the input to a programmable computing array 402-M as being input to a memory in logic cell 404-N similarly configured to perform a NAND logic function, embodiments are not limited to this example.

As one of skill in the art will appreciate upon reading this disclosure, one or more embodiments include an output from a first programmable array, having cells configured to perform the first logical operation, being provided as an input to a second programmable array, having cells configured to perform as second, different logical operation. Additionally, a first output from a first programmable array can be provided as an input to a second programmable array and a second output from the first programmable array can be provided as an input to a third programmable array via the programmable routing structures, 410, 412, etc., described herein.

FIGS. 5A-5H illustrate an embodiment of the process steps in forming a transistor with a floating gate, a control gate, and back gate to be configured as a memory in logic cell in a programmable computing array. In various embodiments, the process in FIGS. 5A-5H creates a self-aligned back gate, control gate, and floating gate in the transistor. In one embodiment a method of forming a combined memory in logic cell comprises forming a first gate structure surrounded by a dielectric on a first substrate according to a complementary metal oxide semiconductor (CMOS) process, flipping, e.g., inverting, the substrate, and bonding the substrate to a second substrate, e.g., donor wafer, such that the first gate structure is positioned as an isolated back gate to serve as a logical input to a memory in logic cell. The method also includes forming a channel region by planarizing the flipped substrate and forming a floating gate and a control gate stack above the channel region according to a CMOS process. A patterning and etching technique can also occur around the floating gate and the control gate stack into the substrate to align the back gate with the stack and a patterning and etching technique can occur according to a self aligned CMOS technique such that the floating gate, the control gate, and the back gate are aligned in width opposing the channel region. Electrical contacts to the channel region, the control gate, and the back gate can be formed such that the control gate, the back gate, and the floating gate serve as a first, a second, and a third logical input to a memory in logic cell structure.

Figure 5A:
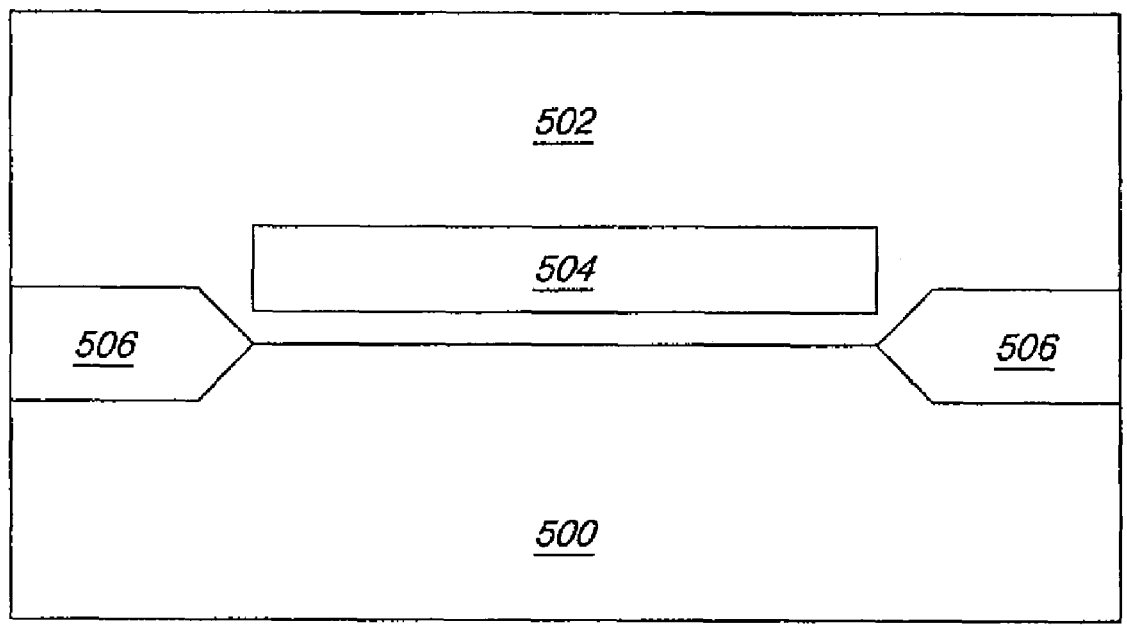
FIGS. 5A-5H illustrate an embodiment of the process steps in forming a transistor with a first gate, a second gate, and a third gate to be configured as a memory in logic cell in a programmable computing array.

FIG. 5A shows a back gate 504 surrounded by a gate oxide 502 with LOCOS 506 as a side cap formed on a first substrate 500. A first gate structure with poly-silicon interconnect is formed using complimentary metal on oxide (CMOS) processing employing oxide isolation and chemical mechanical planarization (CMP) for planarization across the wafer. The first structure is comprised of a back gate 504 which is surrounded by a gate oxide 502 and LOCOS 506 as side caps.

Figure 5B:
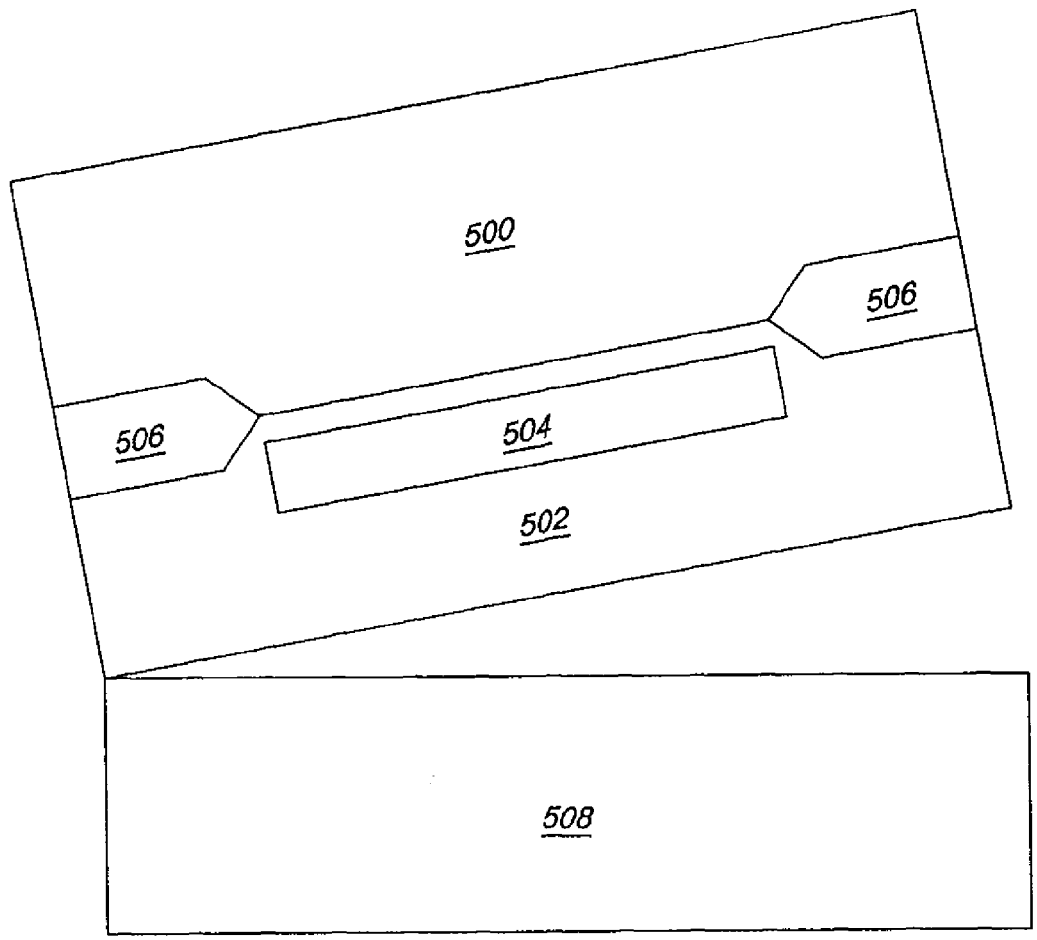

In FIG. 5B, a step in forming a transistor with a floating gate, a control gate, and back gate is shown. The back gate structure 504, gate oxide 502, first substrate 500, and LOCOS 506 are then flipped and the gate oxide 502 bonded to a second substrate, e.g., donor wafer, 508. The second substrate 508 is present during the process steps to form the transistor and removed by steps known in industry once the functional features of the transistor are formed. This orients the back gate 504 on the bottom of the structure and allows for further processing steps to be completed on the structure.

Figure 5C:
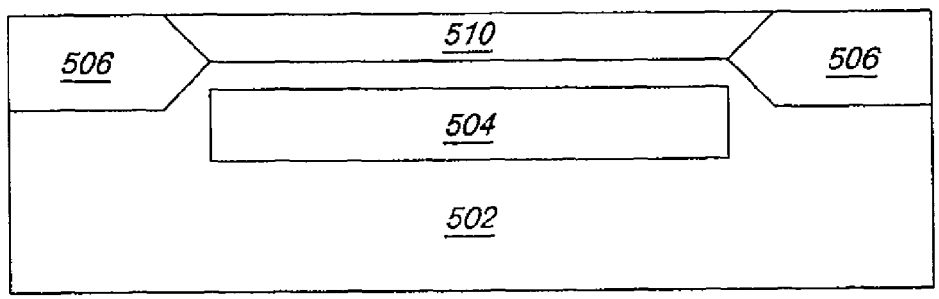

In FIG. 5C, the silicon layer 510 forming the body of the transistor is fabricated. The first substrate 500 is polished by CMP to form the silicon layer 510. The polishing of the first substrate to a desired thickness forms the body region for the transistor, which is where the channel is formed that allows conduction between the source and drain regions in the transistor.

Figure 5D:
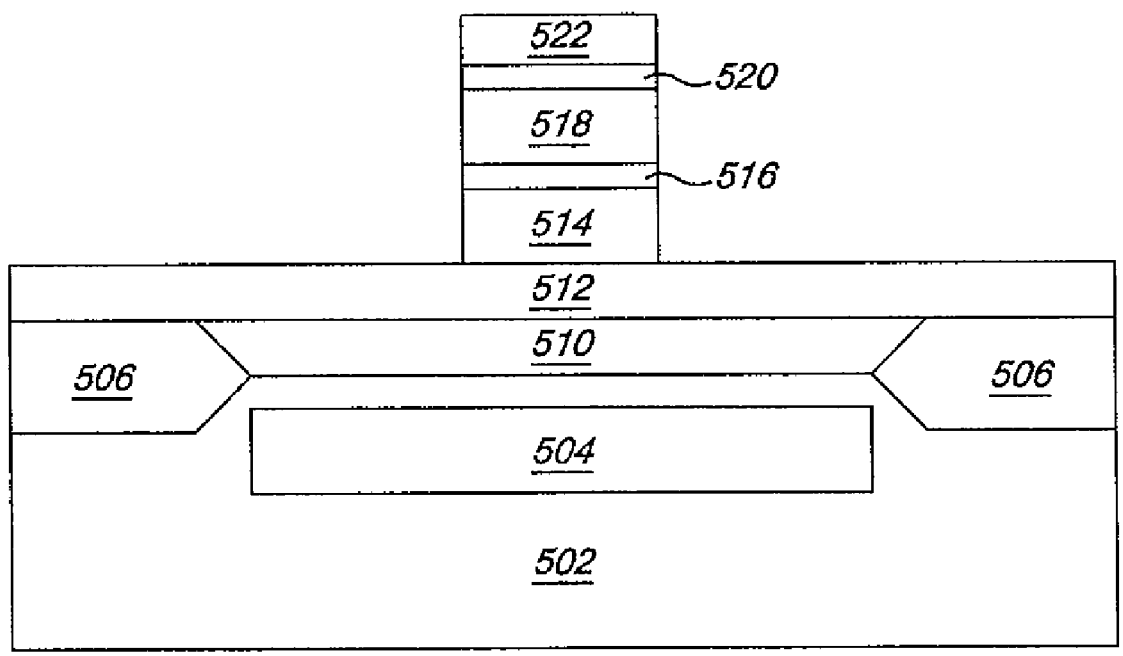

In FIG. 5D, alternating nitride and oxide layers are deposited and etched to pattern and form the stack containing the control gate and the floating gate. A gate oxide layer 512 is formed on the silicon channel layer 510. The floating gate 514 is formed on the gate oxide layer 512. In various embodiments, the floating gate can be formed from a dope poly-silicon or a nitride. A control gate dielectric 516 is formed on the floating gate, which in various embodiments could be an oxide. The control gate 518 is formed with the control gate dielectric 516 between the control gate 518 and the floating gate 514. In some embodiments, the control gate 518 is formed from poly-silicon. An oxide dielectric layer 520 is form on the control gate 518 and the stack is capped with a nitride layer 522.

Figure 5E:
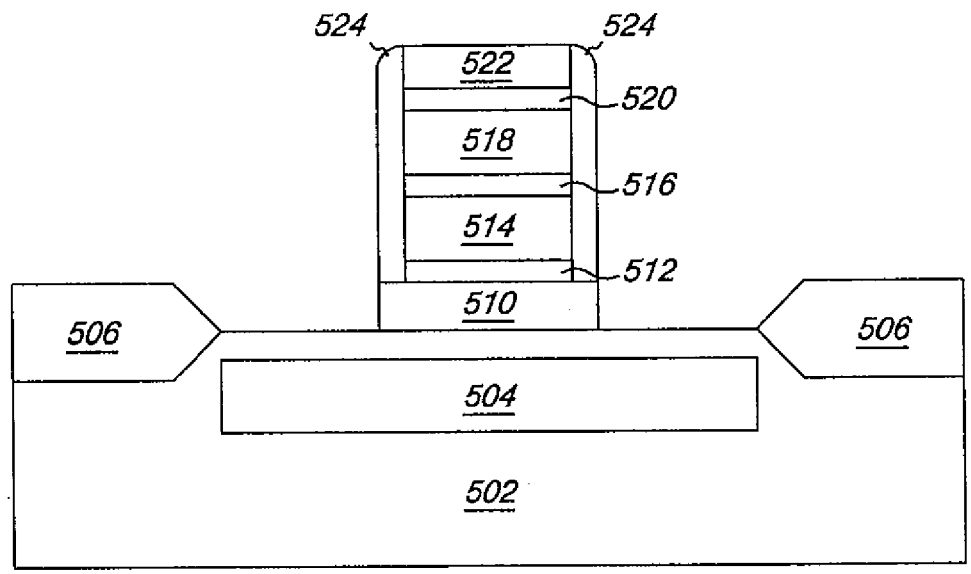

In FIG. 5E, the silicon channel 510 is etched to a thickness that is determined by the desired operating characteristics and threshold voltages. The silicon channel's thickness is defined by oxide spacers 524 that are formed on each side of the stack. Oxide spacers 524 are added to each side of the pillar to allow the silicon channel 510 to be etched to a thickness where the outer edge of the two oxide spacers 524 define the thickness of the silicon channel 510.

Figure 5F:
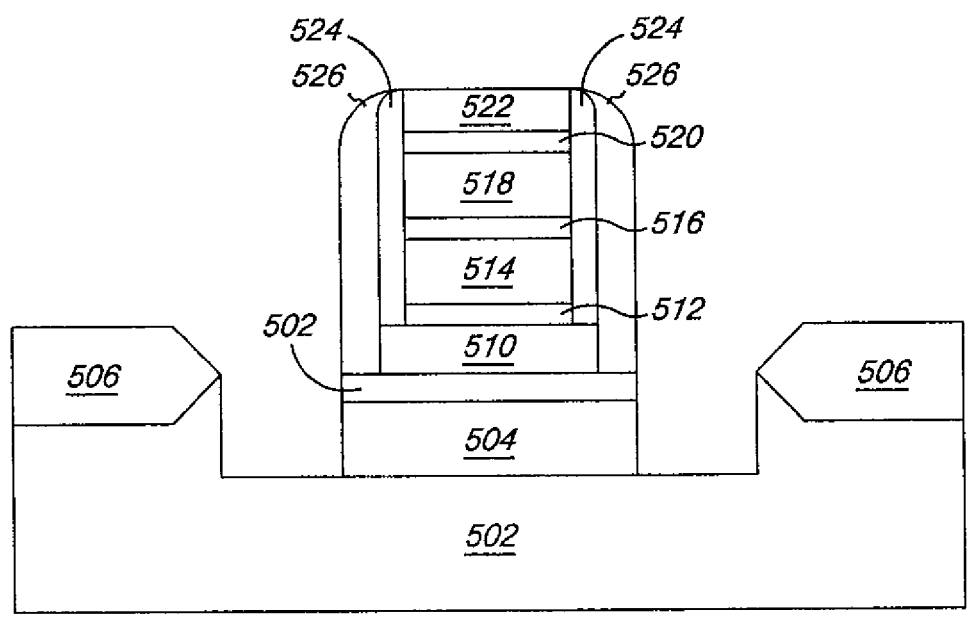

In FIG. 5F, the back gate 504 is etched to a thickness defined by nitride spacers 526. The back gate thickness is determined by self aligning the back gate 504 with the thickness of the nitride spacers 526. Nitride spacers 526 are added to each side of the stack, whereby the outer edge of the nitride spacers define the thickness of the back gate 504. The oxide layer 502 that is between the back gate 504 and the silicon channel 510 is etched along with the portion of the back gate 504 region outside of the edges of the nitride spacers 526. This etching forms the operational portion of the back gate 504 and defines the thickness of the back gate 504.

Figure 5G:
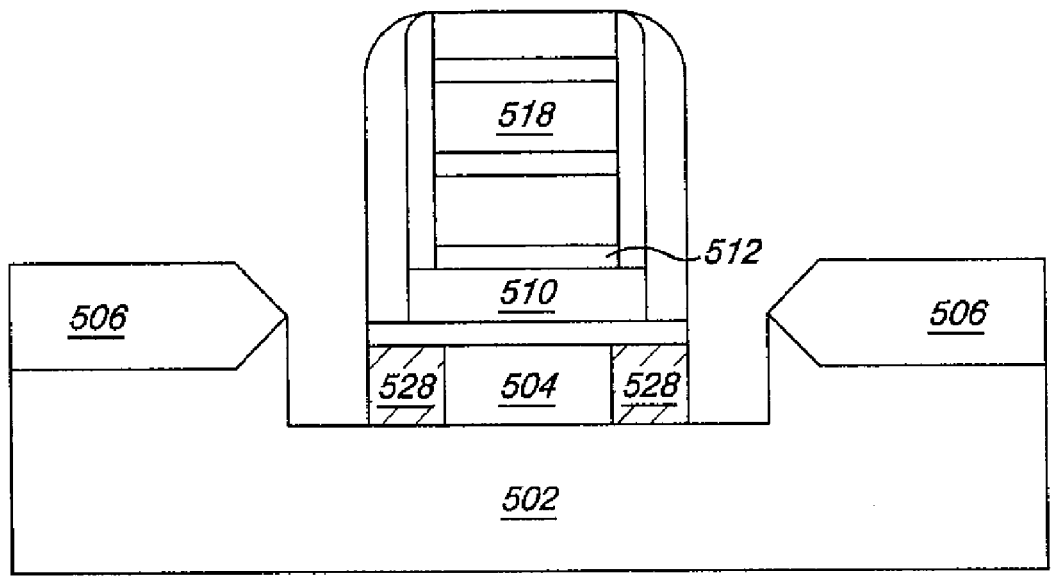

In FIG. 5G, the operational back gate thickness is adjusted. The back gate 504 is oxidized to undercut and insulate. An oxidized region 528 is formed on each end of the back gate 504. In some embodiments, the oxidation process narrows the back gate to the same thickness as the control gate 518 and the floating gate 514.

Figure 5H:
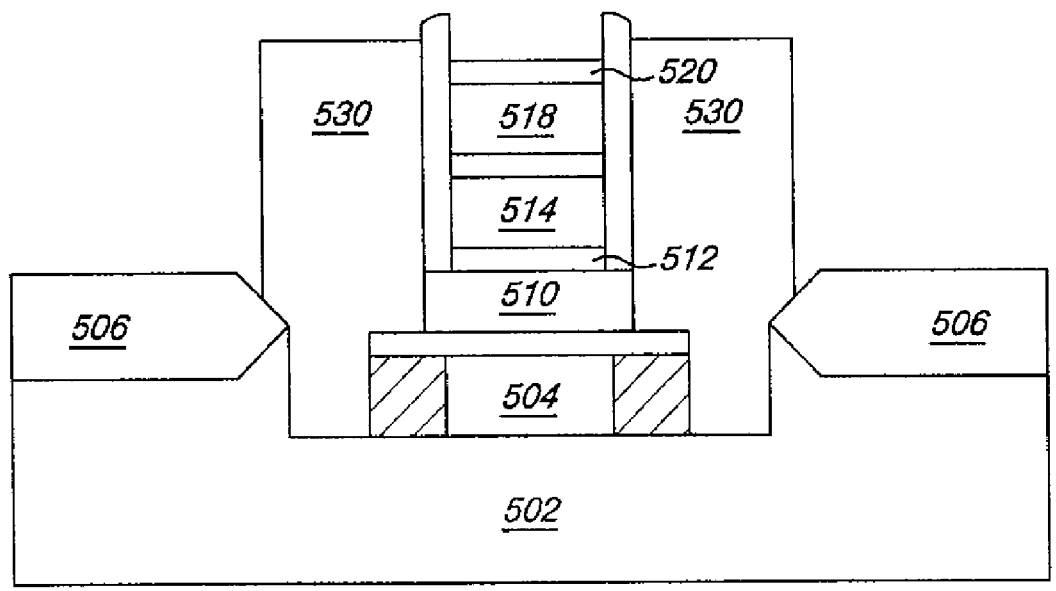

In FIG. 5H, the source and drain regions are defined for the transistor. The nitride spacers 526 are removed and doped poly-silicon is deposited in the void left from the etching that defined the back gate 504 thickness and the removal of the nitride spacers 526. The source and drain regions 530 are then defined by the poly-silicon area that is in contact with the ends of the silicon channel 510.

Conclusion

Methods, devices, and systems for a memory in logic cell are provided. One or more embodiments include using a cell structure having a first gate, a second gate, and a third gate, e.g., a control gate, a back gate, and a floating gate, as a memory in logic cell. The method includes programming the floating gate to a first state to cause the memory in logic cell to operate as a first logic gate type. The method further includes programming the floating gate to a second state to cause the memory in logic cell to operate as a second logic gate type.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of forming a memory in logic cell, comprising:
   forming a first gate structure surrounded by a dielectric on a substrate according to a complementary metal oxide semiconductor (CMOS) process;
   flipping the substrate such that the first gate structure is positioned as an isolated back gate to serve as a logical input to the memory in logic cell;
   forming a channel region by planarizing the flipped substrate; and
   forming a floating gate and a control gate stack above the channel region according to a CMOS process.

2. The method of claim 1, wherein the method includes patterning and etching around the floating gate and the control gate stack into the substrate to align the back gate with the stack.

3. The method of claim 2, wherein the method includes patterning and etching according to a self aligned CMOS technique such that the floating gate, the control gate, and the back gate are aligned in width opposing the channel region.

4. The method of claim 3, wherein the method includes forming electrical contacts to the channel region, the control gate, and the back gate such that the floating gate, the control gate, and the back gate serve as a first, a second, and a third logical input to the memory in logic cell structure.

5. The method of claim 2, wherein the method includes forming a first oxide spacer on a first side of the stack and a second oxide spacer on a second side of the stack.

6. The method of claim 5, wherein the method includes removing a portion of a floating gate dielectric and a portion of the silicon channel to define a first end of the silicon channel vertically aligned with the first oxide spacer and a second end of the silicon channel vertically aligned with the second oxide spacer.

7. The method of claim 6, wherein the method includes forming a first nitride spacer on the first side of the stack and a second nitride spacer on the second side of the stack.

8. The method of claim 7, wherein the method includes removing a portion of the back gate to define a first end of the back gate vertically aligned with the first nitride oxide spacer and a second end of the back gate vertically aligned with the second nitride spacer.

9. The method of claim 8, wherein the method includes oxidizing the back gate to undercut the back gate in alignment with a width of the floating gate.

10. A method of forming a memory in logic cell, comprising:
    forming a first gate structure surrounded by a dielectric on a first substrate according to a complementary metal oxide semiconductor (CMOS) process;
    inverting the first substrate and bonding the first substrate to a second substrate such that the first gate structure is positioned as an isolated back gate to serve as a first logical input to the memory in logic cell;
    forming a channel region by planarizing the inverted first substrate;
    forming a stack that includes a floating gate and a control gate over the channel region; and
    aligning the stack with the back gate.

11. The method of claim 10, wherein the method includes forming electrical contacts to the channel region, the control gate, and the back gate such that the control gate serves as a second logical input to the memory in logic cell.

12. The method of claim 11, including forming the memory in logic cell such that the memory in logic cell provides different logical outputs, in response to different combinations of the first and second logical inputs, for a given programmed state of the floating gate.

13. A method of forming a memory in logic cell, comprising:
    forming a first gate structure surrounded by a dielectric on a substrate according to a complementary metal oxide semiconductor (CMOS) process;
    flipping the substrate such that the first gate structure is positioned as an isolated back gate to serve as a first logical input to the memory in logic cell; and
    forming a stack including a control gate and a floating gate over a channel region on the substrate;
    wherein the control gate is formed to receive a first logical input and the back gate is formed to receive a second logical input; and
    wherein the memory in logic cell is formed to perform a first logical operation based on the first logical input and the second logical input when the floating gate is programmed to a first state and to perform a second logical operation based on the first logical input and the second logical input when the floating gate is programmed to a second state.

14. The method of claim 13, including forming the memory in logic cell such that the memory in logic cell performs a NAND logic function in response to the first state of the floating gate and a NOR logic function in response to the second state of the floating gate.

15. The method of claim 13, including forming the memory in logic cell such that it provides different logical outputs, based on different combinations of the first and second logical inputs, for a given programmed state of the floating gate.

16. The method of claim 13, including forming the floating gate to receive a third logical input.

17. The method of claim 13, including forming the memory in logic cell such that an output of the cell serves as an input to a second memory in logic cell.

* * * * *